United States Patent [19]

Kuhn, Jr.

[11] 3,930,169

[45] Dec. 30, 1975

[54] CMOS ODD MULTIPLE REPETITION RATE DIVIDER CIRCUIT

[75] Inventor: Harry A. Kuhn, Jr., Phoeniz, Ariz.

[73] Assignee: Motorola, Inc., Chicago, Ill.

[22] Filed: Sept. 27, 1973

[21] Appl. No.: 402,491

[52] U.S. Cl. .......... 307/225 C; 307/205; 307/224 C; 307/279; 328/46; 328/48

[51] Int. Cl.$^2$ .................... H03K 23/08; H03K 21/36; H03K 19/08; H03K 3/33

[58] Field of Search .... 307/205, 214, 220 C, 222 R, 307/223 C, 224 R, 224 C, 225 R, 225 C, 251, 279; 328/37, 43, 46, 48

[56] References Cited

UNITED STATES PATENTS

| | | | |
|---|---|---|---|
| 3,110,821 | 11/1963 | Webb | 307/225 R X |
| 3,258,696 | 6/1966 | Heymann | 307/224 R X |
| 3,369,183 | 2/1968 | Mester | 328/48 |
| 3,439,278 | 4/1969 | Farrow | 307/225 R X |
| 3,513,329 | 5/1970 | Washizuka et al. | 307/223 C |
| 3,560,998 | 2/1971 | Walton | 58/23 A |
| 3,577,085 | 5/1971 | Stutz | 328/46 X |
| 3,657,557 | 4/1972 | Smith et al. | 307/225 C |
| 3,673,501 | 6/1972 | Zeph | 307/223 R X |
| 3,725,791 | 4/1973 | Moreau | 328/46 X |
| 3,739,193 | 6/1973 | Pryor | 307/214 X |
| 3,745,315 | 7/1973 | Brendzel | 328/48 |
| 3,818,354 | 6/1974 | Tomisawa et al. | 307/225 R X |

FOREIGN PATENTS OR APPLICATIONS

| | | | |
|---|---|---|---|
| 1,134,065 | 11/1968 | United Kingdom | 307/223 R |

OTHER PUBLICATIONS

Hastings, "Complementary Shift Register;" IBM Tech. Discl. Bull., Vol. 13, No. 2, pp. 493–494, 7/1970.

Faggin et al., "Silicon Gate Technology;" Solid State Electronics, Pergamon Press (1970); Vol. 13, No. 8, pp. 1125–1143.

St. John, "Frequency Divide By Three Circuit;" IBM Tech. Discl. Bull., Vol. 15, No. 9, pp. 2717–2718, 2/1973.

Southworth, "Reset of Shift Register Counters;" IBM Tech. Disd. Bull., Vol. 14, No. 5, pp. 1525–1526; 10/1971.

*Primary Examiner*—Michael J. Lynch
*Assistant Examiner*—L. N. Anagnos
*Attorney, Agent, or Firm*—Vincent J. Rauner; Michael D. Bingham; Maurice J. Jones, Jr.

[57] ABSTRACT

The disclosed divider circuit divides the repetition rate of an input signal by an odd integer to provide an output signal. The divider includes at least four binary cells and either a NOR and a NAND gate. Each binary cell includes first and second inversely clocked transmission gates and first and second inverters. Selected output terminals of three of the binary cells are connected to the input terminals of the gate and the output terminal of the gate is connected to the input terminal of the fourth binary cell. The resulting circuit configuration lends itself to fabrication by CMOS processes and takes up only a small amount of chip area.

9 Claims, 8 Drawing Figures

TRUTH TABLE FOR
FLIP-FLOP 57

| BIT TIME N | | BIT TIME N+1 |
|---|---|---|
| D | $Q_T$ | $Q_T+1$ |
| 1 | 0 | 1 |
| 0 | 1 | 0 |
| 1 | 1 | 1 |
| 0 | 0 | 0 |

TIMING WAVEFORMS FOR DIVIDER 50

TIMING WAVE FORMS FOR DIVIDER 110

CMOS ODD MULTIPLE REPETITION RATE DIVIDER CIRCUIT

CROSS REFERENCE TO A RELATED APPLICATION

The subject matter of the present patent application is related to the subject matter of an application entitled "CMOS Even Multiple Repetition Rate Divider circuit", which was filed on June 26, 1973, for the present inventor and Uryon S. Davidsohn and which bears Ser. No. 373,709.

BACKGROUND OF THE INVENTION

There are many requirements in electrical systems for "divider" circuits which divide the repetition rate of a periodic rectangular input signal by an odd integer. For instance, one such requirement occurs in the circuitry of an electrical horological instrument wherein "timing" signals are derived from a crystal controlled oscillator output signal for driving a time indicator which may be a liquid crystal display. More particularly, in a timepiece, one second and 60 second timing signals are frequently required to respectively drive second and minute indicators. A divide-by-60 divider may count 60 "second" timing pulses to provide a "minute" timing pulse. Odd multiple dividers are required to form the divide-by-60 divider, which may be comprised of a divide-by-five, a divide-by-three and two divide-by-two dividers, for instance. Such odd multiple divider circuits must be compact enough to be included within the housing of an electrical wristwatch, for instance. Since electrical wristwatches are powered by a battery, which contains a limited quantity of power, the odd multiple divider circuit must also be designed to draw a minimum amount of power.

To meet the minimum power and compactness requirements, some prior art dividers have been designed using CMOS (complementary-metal-oxide-semiconductor) transistors which form inverters and transmission gates. In such CMOS dividers, one of the two field effect transistors (FETs) of each of the inverters remains nonconductive for most of the inverter duty cycle to conserve electrical power. CMOS circuits also have other advantages such as noise rejection, large fan out capability, stability over a wide temperature variation and single supply operation.

Since CMOS circuits use two transistors to do the same job that one does in many P-channel circuits, for instance, it is desirable for CMOS divider circuits to use as few components as practicable. As the number of components goes up, yields go down and costs go up. Some prior art divider circuits contain too many components to be economically manufactured in CMOS integrated circuit form.

More specifically, prior art odd multiple dividers are sometimes provided by using a string of flip-flops having outputs which are monitored by gates. When a predetermined count is created all of the flip-flops are reset by a gate signal. As a result, a "race" situation sometimes occurs wherein one of the flip-flops resets faster than the flip-flops. As soon as one of the flip-flops resets the gate signal terminates. Unfortunately, some of the other flip-flops may not have reset and provide erroneous signals. To overcome this problem, a set-reset flip-flop is sometimes used to store the reset signal until all of the flip-flops have reset. The layout area required by such prior art dividers is undesirably large.

Electronic watch and clock circuits often include mechanical switches which enable setting and power turn-on and turn-off. The contacts of such mechanical switches have a tendency to bounce against each other thereby providing a discontinuous signal which may falsely trigger some types of prior art flip-flop circuits used in dividers. The false triggering makes setting of electronic watches including such divider circuits difficult. Moreover, some such prior art dividers may also be triggered by other transient signals occurring on the conductors within the horological instrument. In addition, some prior art divider circuits are difficult to reset and, consequently, are not suitable for use in settable counters.

SUMMARY OF THE INVENTION

It is an object of the invention to provide an improved repetition rate divider circuit.

Another object of this invention is to provide an odd multiple CMOS divider circuit.

A further object of this invention is to provide an improved CMOS odd-multiple frequency divider circuit which utilizes a minimum number of devices.

A still further object of this invention is to provide an improved CMOS odd multiple divider circuit which is substantially immune to spurious intermittent signals created by mechanical switch bounce.

An additional object of this invention is to provide a CMOS odd multiple divider circuit which is suitable for use in a divide-by-60 divider which is included in a horological instrument.

A still additional object of the invention is to provide an odd multiple divider for use as a counter circuit and which can be easily reset to a predetermined count.

The odd multiple divider circuit of the invention includes at least four binary cells and either a NAND or a NOR gate. The cells are connected in a cascaded or serial fashion and are inversely or alternately clocked by the input signal. The input terminals of the gate are connected to the output terminals of the last three cells and the output terminal of the gate is connected to the input node of the first cell. Consequently, if a NAND gate is utilized, for instance, it provides a series of "1" signals which are successively clocked through the binary cells until all of the inputs of the NAND gate are at a 1 level at which time the NAND gate provides a series of logical 0's until one of the logical 0's is clocked through the string of cells and reaches an input of the NAND gate. Alternatively, if a NOR gate is utilized, it provides a series of logical 0's until all of the NOR gate inputs are at the logical 0 level in response to which the NOR gate provides logical 1's. The order of the odd multiple division performed can be increased by adding additional pairs of cells in the feedback loop extending from the output of the gate to the input of the gate. The divider circuit can be utilized as a counter by including an additional input terminal on the gate and a switch for connecting this fourth input terminal to either the positive supply line or to the ground or negative supply line.

DETAILED DESCRIPTION OF THE PREFERRED EMBODIMENT

Figure 1:
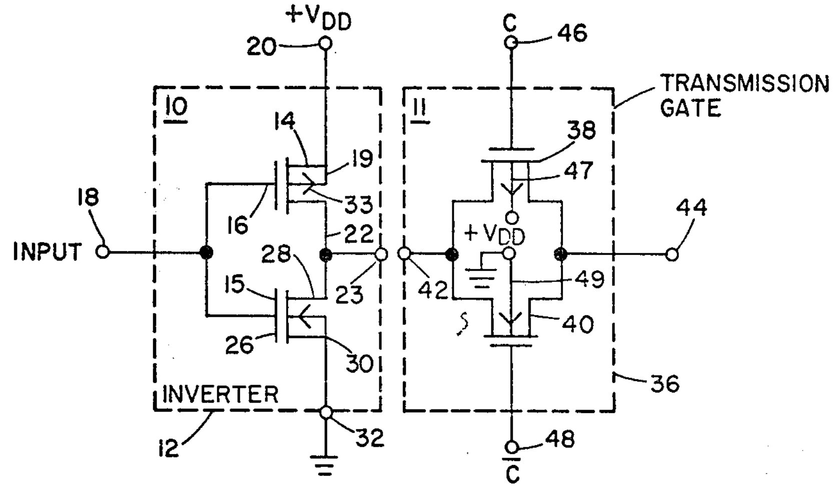
FIG. 1 is a schematic diagram illustrating an inverter and a transmission gate used in the divider circuit of one embodiment of the invention.

FIG. 1 is a schematic diagram of an inverter 10 and a transmission gate 11. Inverter 10, which is enclosed by dashed block 12, is comprised of a P-channel MOS enhancement mode FET 14 and an N-channel MOS enhancement mode FET 15. Gate electrode 16 of FET 14 is connected to inverter input terminal 18 and source electrode 19 is connected to power terminal 20, which is adapted to apply a positive power supply voltage of on the order of 1.5 volts. Drain electrode 22 is connected to inverter output terminal 23. P-channel MOS transistor 14 is nonconductive except when gate 16 is made more negative than source 19 by a potential difference exceeding the device threshold voltage. Since source 19 is connected to a positive potential, a positive input voltage which is less positive than the supply voltage by a difference which exceeds the threshold voltage renders transistor 14 conductive.

N-channel MOSFET 15 includes a gate electrode 26 which is connected to inverter input terminal 18, drain electrode 28 which is connected to inverter output terminal 23 and a source electrode 30 which is connected to ground or reference terminal 32. N-channel MOS transistor 15 is nonconductive except when gate 26 is made more positive than source 30 by a potential difference exceeding the device threshold voltage.

FETs 14 and 15 may be fabricated by the "silicon-gate" process so that the threshold or "turn-on" voltages thereof are relatively low, for instance between 0.2 and 1 volt. This silicon-gate process, which is known in the art, enables gates 16 and 26 of FETs 14 and 15 to be formed from polycrystalline silicon. As a result, MOSFETs 14 and 15 have a higher speed and take up less space than comparable IGFETs formed by the "metal-gate" process, for instance.

In applications such as those involving electrical wristwatches where it is essential to conserve power, it is desirable that only one of the inverter FETs 14 and 15 be rendered conductive during most of the inverter duty cycle. In operation, if a logical 1 having a sufficiently high positive magnitude is applied to input terminal 18, then N-channel FET 15 is rendered conductive and P-channel FET 14 is rendered nonconductive. Hence, a low level or logical 0 signal is applied to output terminal 23 in response to the logical 1 at input terminal 18. Alternatively, if a logical 0 having a sufficiently low magnitude is applied to input terminal 18 then gate electrode 16 is made more negative than source 19 so that FET 14 is rendered conductive and FET 15 is rendered nonconductive. As a result, the positive power supply voltage ($V_{DD}$) occurring at terminal 20 is applied through the drain-to-source channel of device 14 to output terminal 23. Hence, a logical 1 signal results at output terminal 23 in response to the logical 0 signal applied to input terminal 18. Substrate 33 of FET 14 is connected to power supply terminal 20 and substrate 35 of FET 15 is connected to ground terminal 32.

Transmission gate or switch 11 of FIG. 1, which is enclosed by dashed block 36, also includes a P-channel MOSFET 38 and an N-channel MOSFET 40. The sources of FETs 38 and 40 are connected to transmission gate input terminal 42 and the drains of FETs 38 and 40 are connected to transmission gate output terminal 44. The gate electrode of FET 38 is connected to terminal 46 to which an input signal, for instance clock signal C, is applied and the gate of FET 40 is connected to terminal 48 to which the complement $\overline{C}$ of the clock signal C is applied, for instance. Substrate 47 of FET 38 is connected to positive power supply terminal 20 and substrate 49 of FET 40 is connected to ground terminal 32.

In operation, both FETs of transmission gate 11 are turned off simultaneously by the clock and clock complement signals so that signals cannot flow in either direction between terminals 42 and 44 through the transmission gate. Alternatively, at other times, both transistors of transmission gate 11 are turned on simultaneously by the clock and clock complement signals so that signals can flow between terminals 42 and 44 through the gate. Transmission gate 11 is comprised of FETs of different conductivity types to assure that both logical 1's and logical 0's, applied to input terminal 42, are transferred to output terminal 44 without loss of amplitude.

Figure 2:
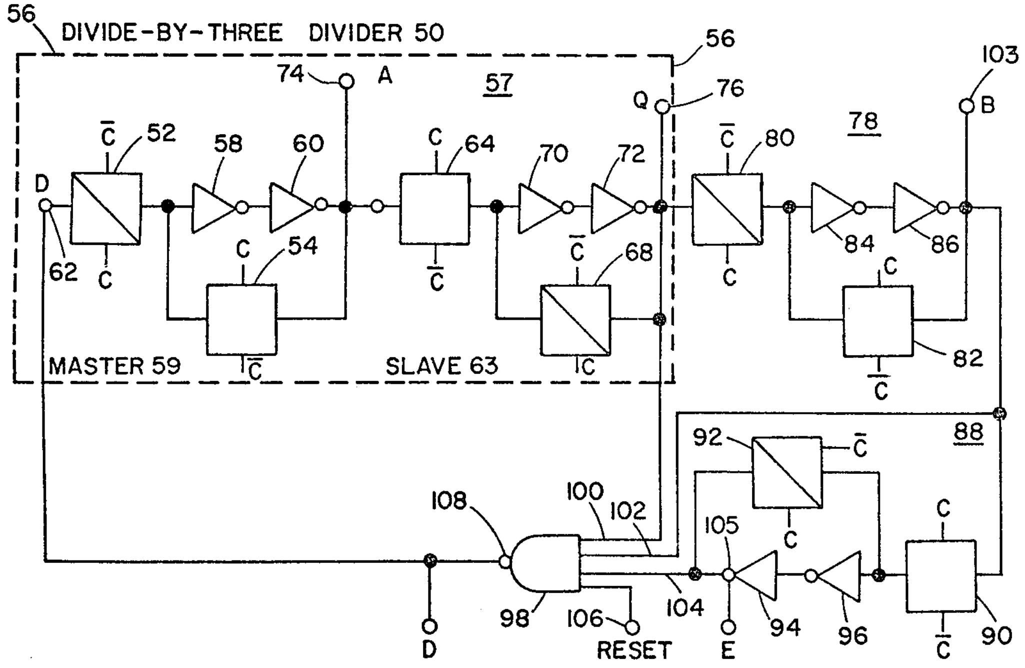
FIG. 2 is a block diagram of a divide-by-three divider which is arranged according to the invention.

FIG. 2 is a block diagram of a divide-by-three divider circuit 50 of one embodiment of the invention. The divider circuit of FIG. 2 includes inverter circuits such as are included within dashed block 12 of FIG. 1, and transmission gate circuits such as are included within dashed block 36 of FIG. 1. Transmission gate symbols comprised of a square with a diagonal slash line through it, for instance gate 52, depict a transmission gate wherein the clock signal C is applied to the gate electrode of the N-channel device and the clock complement signal $\overline{C}$ is applied to the gate electrode of the P-channel device. On the other hand, transmission gates represented by the square without the diagonal line through it, for instance gate 54, indicates that the clock complement signal $\overline{C}$ is applied to the gate electrode of the N-channel device and the clock signal C is applied to the gate electrode of the P-channel device. Consequently, transmission gate 52 is rendered conductive during the time that the clock signals have a logical 1 state and nonconductive during the time that the clock signals have a logical 0 state. Alternatively, transmission gate 54 is rendered conductive during the time that the clock signals have a logical 0 state and nonconductive during the time that the clock signals have a logical 1 state. As a result, such transmission gates are alternately conductive during successive half cycles of the clock signals. Hence, the two transmission gates of each cell are said to be "inversely clock".

The circuitry divider 50 of FIG. 2 included within dashed block 56 comprises master-slave bistable multivibrator or flip-flop 57. The "master" portion 59 of flip-flop 57 includes two inverters 58 and 60 and two transmission gates 52 and 54. Inverters 58 and 60 are connected together in a serial fashion and transmission gate 54 provides a "refresh" feedback path from the output terminal of inverter 60 to the input terminal of inverter 58. Transmission gate 52 connects the input terminal of inverter 58 to flip-flop input terminal 62. "Slave" portion 63 of flip-flop 57 also includes two transmission gates 64 and 68 and two inverters 70 and 72. Transmission gate 68 connects the output terminal of inverter 72 to the input terminal of inverter 70. Moreover, transmission gate 64 connects input terminal 74 of the slave portion to the input terminal of inverter 70.

Figures 3, 4:
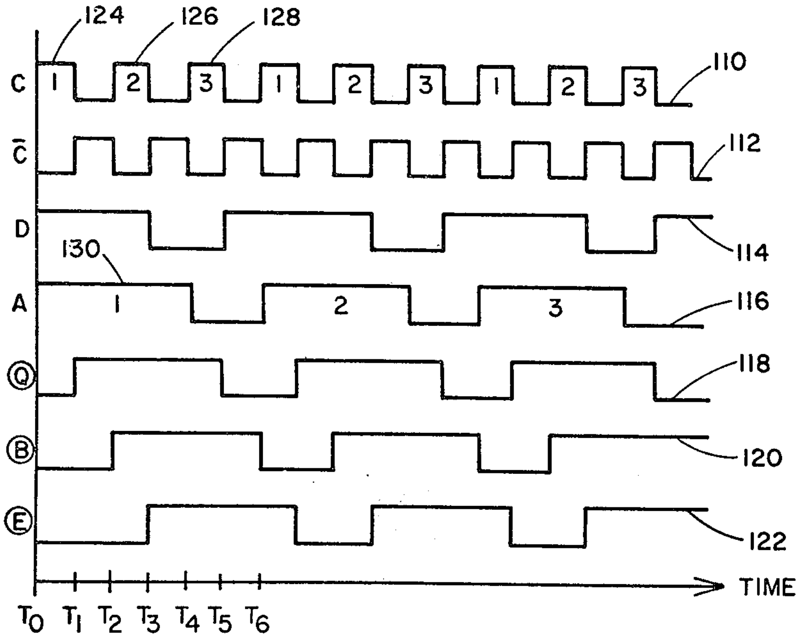
FIG. 3 is a truth table for the flip-flop of FIG. 2.
FIG. 4 is a timing diagram showing waveforms which illustrate the operation of the divider circuit of FIG. 2.

FIG. 3 is a truth table for flip-flop 57. The binary states in the column marked D referred to the logical signal states at input 62. The symbol $Q_T$ refers to the signal states at output terminal 76, which exists immediately before a clock transition, and the symbol $Q_{T+1}$ refers to the output signal state at Q terminal 76 immediately after a clock transition. By comparing the states of the D signal with the states of the $Q_{T+1}$ signal, it is evident that the $Q_{T+1}$ output signal of the flip-flop is the same as the D input signal except that the $Q_{T+1}$ output signal is delayed with respect to the D input signal. The operation of flip-flop 57 will be explained in greater detail. Master-slave sections 59 and 63 each comprise a binary cell because they each have two stable states.

Divider 50 also includes a binary cell 78 that is identical to master portion 59 of flip-flop 57. Cell 78 includes two transmission gates 80 and 82 and two inverters 84 and 86. Moreover, binary cell 88 is identical to slave portion 63 of flip-flop 57. Cell 88 includes two transmission gates 90 and 92 and two inverters 94 and 96. Thus, cells 78 and 88 also form a flip-flop having a function represented by the truth table of FIG. 3.

NAND gate 98 includes input terminals 100, 102, and 104 and RESET terminal 106. Input terminal 100 is connected to output terminal 76 of flip-flop 57, input terminal 102 is connected to output terminal 103 of inverter 86, and input terminal 104 is connected to the output terminal 105 of inverter 94. NAND gate 98 also includes an output terminal 108 which is connected to input terminal 62 of flip-flop 57. NAND gate 98 provides a D signal comprised of logical 1's at output terminal 108 at all times except when signal states Q, B and E at respective input terminals 100, 102 and 104 are all logical 1's.

FIG. 4 is a timing diagram showing waveforms which are useful in understanding the operation of divide-by-three divider 50. More specifically, assume at time $T_0$ that clock signal C, represented by waveform 110, is at a logical 1 state and that clock complement signal $\overline{C}$, represented by waveform 112, is at logical 0 state. Hence, gates 52, 68, 80 and 92 are conductive. Further assume that the Q, B and E, respectively represented by waveforms 118, 120 and 122, input signals to NAND gate 98 are all at the logical 0 state so that the D signal at terminal 108 of NAND gate 98 is a logical 1. The logical 1 D input signal, which is represented by waveform 114, is transferred through transmission gate 52, inverted by inverter 58 and inverted again by inverter 60 to form a logical 1 A signal at output terminal 74. This A signal is represented by waveform 116.

At time $T_1$, C and $\overline{C}$ signals reverse states so that transmission gate 52 is no longer conductive but transmission gates 54, 64, 82 and 90 are rendered conductive. As a result, the logical 1 signal at terminal 74 is refreshed through transmission gate 54 and connected through transmission gate 64, inverted by inverters 70 and 72 to change the state of the Q signal at output terminal 76 to a logical 1, as indicated by waveform 118. At time $T_2$, transmission gates 52, 68, 80 and 92 are again rendered conductive. The A signal at terminal 74 remains at a 1 state, the Q signal is refreshed and remains at the 1 state and a logical 1 signal is transferred through transmission gate 80, inverted by inverter 84 and reinverted by inverter 86 to cause the B signal to assume the logical 1 state, as indicated by waveform 120. At time $T_3$, transmission gates 52, 68, 80 and 92 are again rendered nonconductive. As a result, the logical 1 of the B signal is conducted by transmission gate 90, inverted by inverter 96 and inverted again by inverter 94 to provide an E signal having a logical 1 signal state as represented by waveform 122.

Hence, shortly after time $T_3$ all of the inputs to NAND gate 98 are at a logical 1. Therefore, the D signal at NAND gate output terminal 108 changes to a logical 0, shortly after time $T_3$.

At time $T_4$ transmission gate 52 is rendered conductive and the logical 0 signal from the NAND gate is conducted through cell 59 to change the A signal from a logical 1 to a logical 0. The D, Q, B and E signal states remain unchanged between times $T_4$ and $T_5$, as indicated by respective waveforms 114, 118, 120 and 122 of FIG. 4. At time $T_5$ transmission gate 64 is rendered conductive to allow the logical 0 at terminal 74 to be applied to terminal 76 so that the Q signal changes from a logical 1 to a logical 0. The logic states of the A, B and E signals remain unchanged between times $T_5$ and $T_6$ as indicated by respective waveforms 116, 120 and 122.

In response to the Q signal state changing from a logical 1 to a logical 0, NAND gate 98 again provides a D signal having a logical 1 signal state as indicated by waveform 114. Thus, in response to three cycles of the clock signal C, which are designated by reference numbers 124, 126 and 128, signal A provides one positive going A cycle 130. Thus, circuit 50 performs a divide-by-three function. Odd multiple divider circuit 50 includes four binary cells each of which include two alternately clocked transmission gates for performing delaying function. The inverters serve to keep the logic levels refreshed. The delay flip-flops of divider 50 are not as complicated as the MOS set-reset flip-flops required by some prior art CMOS divider configurations. Moreover, an additional set-reset flip-flop is not required to preserve a signal state while divider 50 is reset. Thus, divide-by-three divider 50 is believed to require far fewer devices than many prior art configurations. As a result, divider 50 takes up less chip area and is more reliable than some prior art divider circuits. Furthermore, because the logical signal states are transferred from master sections 59 and 78 to slave sections 63 and 88 only when transmission gates 64 and 90 are rendered conductive at the negative excursions of the clock signal, neither section is affected by further spurious transitions of the D signal line. This is because transmission gates 52 and 80 remain nonconductive as long as the clock complement signal $\overline{C}$ is present. Therefore, divider circuit 50 is substantially immune to spurious intermittent signals created by mechanical switch bounce or otherwise induced in the circuit. Moreover, CMOS odd multiple divider circuit 50 is suitable for use in a divider which is included in a horological instrument, such as a "cordless" desk clock.

Figure 5:
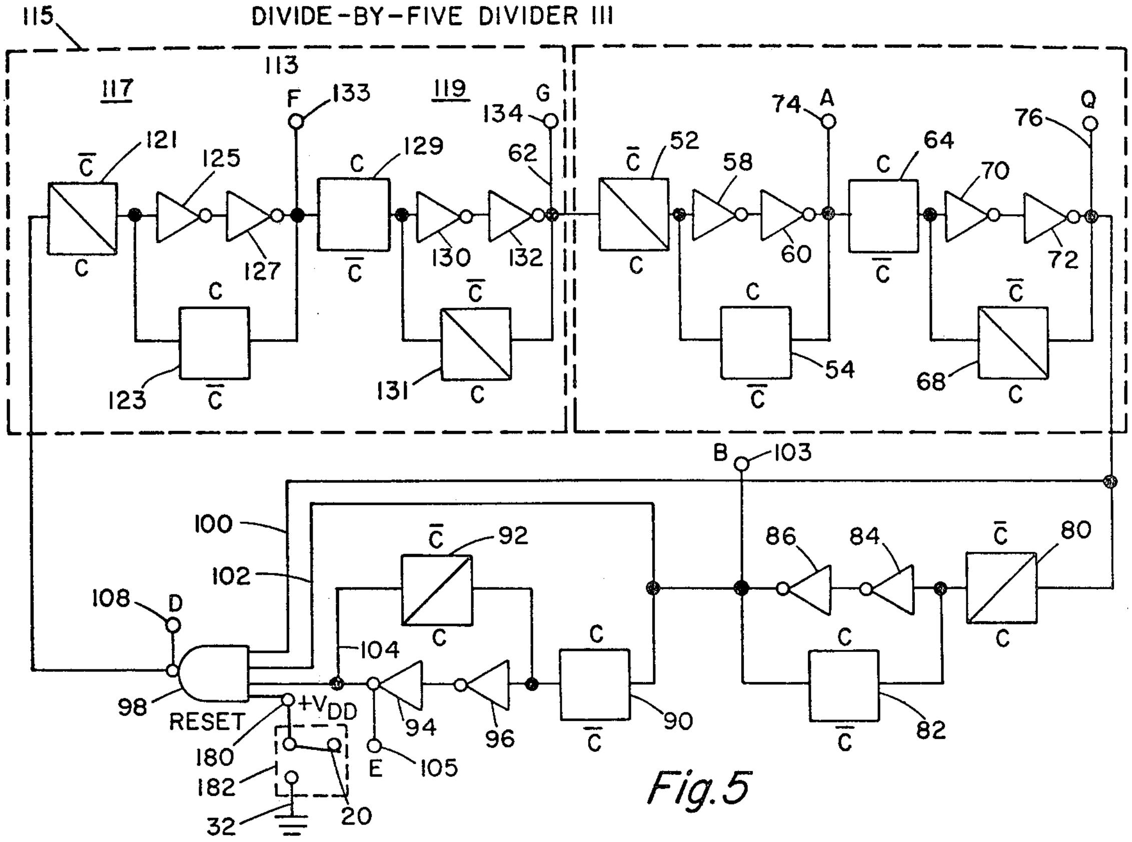
FIG. 5 is a block diagram of a divide-by-five divider which is arranged according to the invention.

FIG. 5 discloses divide-by-five divider 111 which is substantially the same as divide-by-three divider 50 except that an additional flip-flop or bistable multivibrator 113, which is included within dashed block 115, has been added to divider 50 to form divider 111. Common reference numbers denote corresponding parts in FIGS. 2 and 5. Bistable multivibrator 113 includes master section 117 and slave section 119. Master section 117 includes transmission gates 121 and 123 and inverters 125 and 127. Slave section 119 includes transmission gates 129 and 131 and inverters 130 and 132. The input terminal of transmission gate 121 is connected to output terminal 108 of NAND gate 98. Terminal 133 at which signal F occurs is connected to the output terminal of inverter 127. Terminal 134 at which signal G occurs is connected to the output terminal of inverter 132.

Divide-by-five divider 111 operates in a manner similar to divide-by-three divider 50 except that flip-flop 113 provides additional delay. Thus, it takes one additional clock pulse to move the logical 1 and the logical 0 signals generated at the output of NAND gate 98 to the input of NAND gate 98. As a result, it takes five clock cycles to provide one output cycle.

Figure 6:
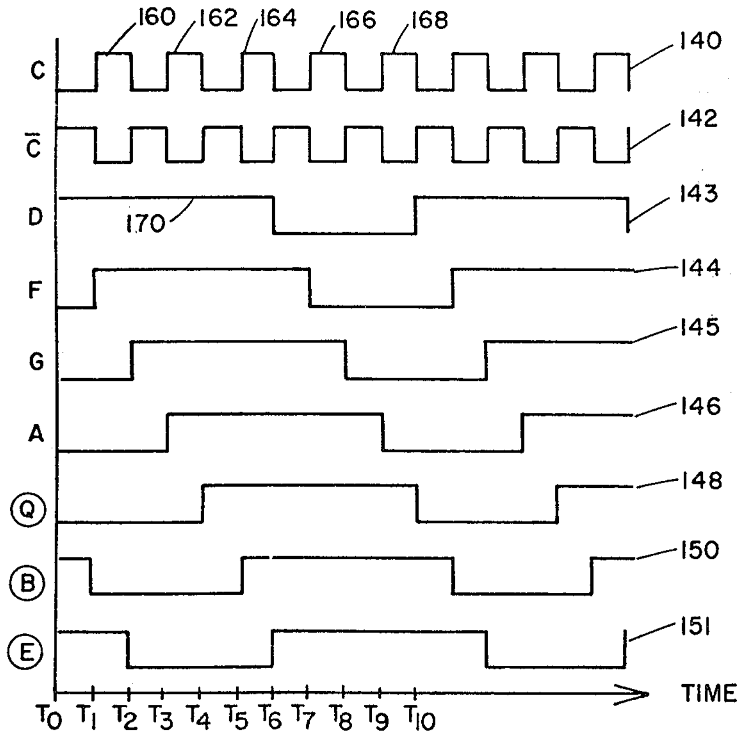
FIG. 6 is a timing diagram showing waveforms which illustrate the operation of the divider circuit of FIG. 5.

FIG. 6 illustrates timing waveforms useful in understanding the operation of divide-by-five divider 111. More specifically, clock signal C is represented by waveform 140 and clock complement signal $\overline{C}$ is represented by waveform 142. Signals D, F, G, A, Q, B and E are respectively represented by waveforms 143, 144, 145, 146, 148, 150 and 151. At time $T_0$ the logic states of signals Q, B and E at the NAND gate input terminals 100, 102 and 104 are respectively assumed to be logical 0, 1 and 1, as indicated in FIG. 6. As a result, NAND gate output signal D is a logical 1 between times $T_0$ and $T_1$.

At time $T_1$ when transmission gates 80 and 121 are rendered conductive, signal B changes from a logical 1 to a logical 0 and signal F changes from a logical 0 to a logical 1. At time $T_2$ when transmission gates 90 and 129 are rendered conductive, the logic states of signals G and E change. At time $T_3$ when transmission gate 52 is conductive, signal A changes to a logical 1. At time $T_4$, a logical 1 is transferred through conductive transmission gate 64 to the output terminal of inverter 72 to change the Q signal and the signal at NAND gate input terminal 100 to a logical 1. Consequently, at time $T_5$ a logical 1 B signal is created and applied to NAND gate input terminal 102 and at time $T_6$ a logical 1 E signal is created and applied to NAND gate input terminal 104. NAND gate 98 responds to all inputs being logical 1's to provide a logical 0 at time $T_6$. It takes four clock transitions occurring at times $T_7$, $T_8$, $T_9$ and $T_{10}$ for this logical 0 to be transferred to change the Q output signal to a logical 0.

Thus, divide-by-five divider 111 responds to five positive clock cycles 160, 162, 164, 166 and 168 to provide one positive output D cycle 170 at output terminal 108. Divide-by-five divider 111 can be transferred into a divide-by-seven divider by inserting another flip-flop such as is included in dashed block 115 between output terminal 108 of NAND gate 98 and the input terminal of transmission gate 121.

NAND gate 98 may be provided with a reset terminal 180 which is selectively connected through a single pole, double throw switch 182 to positive power supply terminal 20 or to ground terminal 32. Switch 182 normally connects reset terminal 180 to power supply terminal 20 so that a logical 1 is normally applied to the NAND gate. If divide-by-five divider 111 is utilized as a counter suitable for counting five pulses, it may be desirable to reset divide-by-five divider 111 to a predetermined state at selected times. For instance, divide-by-five circuit 111 may form a section of a counter for counting 60 seconds to provide a one minute timing pulse in an electronic clock. The clock time setting mechanism such as a stem operates switch 182 so that is connects ground terminal 32 to reset terminal 180 of gate 98 to clear the counter. As a result, NAND gate 98 will provide a series of 1's in response to each of the clock signals so long as the reference potential is applied to reset terminal 180. Immediately after switch 182 is released, the output signal states of divider 110 are all set to a 1 level so that NAND gate 98 provides a 0 level to transmission gate 118 to begin the count of five from a count of 0. Without reset switch 182, it would be difficult to utilize divide-by-five divider in a counter which must begin counting from 0 at a predetermined time. The described reset mechanism can be included in divide-by-three divider 50 by utilizing "RESET" terminal 106 in the above-described manner.

Figure 7:
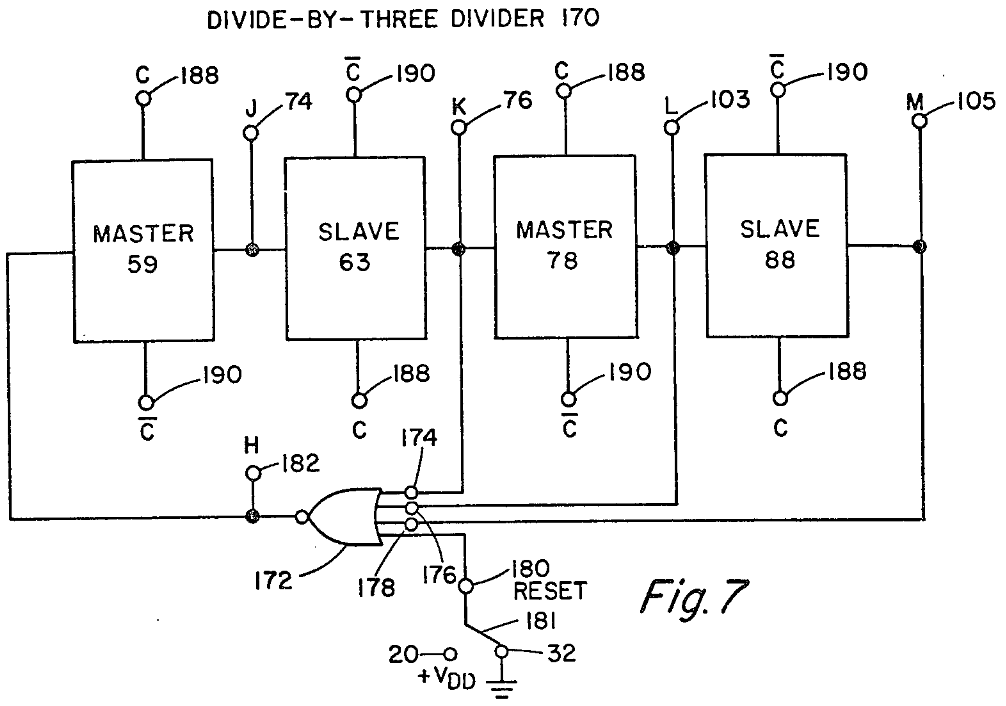
FIG. 7 is a block diagram of another divide-by-three divider arranged pursuant to the invention.

Divide-by-three divider 50 and divide-by-five divider 111 can be modified replacing NAND gate 98 with a NOR gate and still perform odd multiple division. More specifically, FIG. 7 illustrates in block form divide-by-three divider 170 which has a configuration identical to that of divide-by-three divider 50 of FIG. 2 except that NAND gate 98 has been replaced by NOR gate 172. Input terminals 174, 176 and 178 of NOR gate 172 are respectively connected to output terminals 76, 103 and 105. NOR gate 172 also includes a reset terminal 180.

In operation, the logic signal states at NOR gate input terminals 174, 176, 178 and 180 must all be logical 0's before a logical 1 is provided at output terminal 182 of NOR gate 172. In other words, if any of the input signals to NOR gate 182 is a logical 1 then NOR gate 172 will provide a logical 0 output signal. It is assumed that a logical 0 is normally applied to reset terminal 180 such as through switch 181. Thus, divider circuit 170 controls the flow of logical 0's in an analogous fashion to how divider 50 controls the flow of logical 1's.

Figure 8:
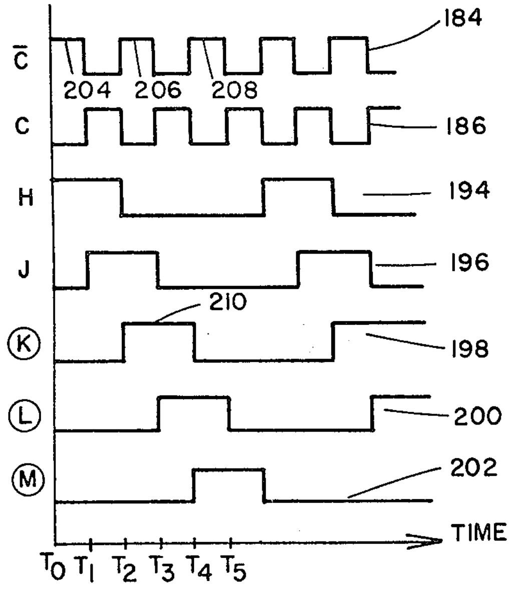
FIG. 8 is a timing diagram showing waveforms which illustrate the operation of the divider of FIG. 7.

FIG. 8 is a timing diagram which is useful in understanding the operation of divide-by-three 170. Waveforms 184 and 186 respectively represent the clock bar and clock signals, which are applied to terminals 188 and 190 of divider 170 as indicated in FIG. 7. Waveforms 194, 196, 198, 200 and 202 respectively represent the waveforms of the signals at terminals 182, 74, 76, 103 and 105. At time $T_0$, the logical signal states of signals K, L and M at the input terminals of NOR gate 172 are all assumed to be logical 0's. Therefore, the H signal at the output terminal of NOR gate 172 is a logical 1. At time $T_1$, master portion 59 is rendered conductive and applies the logical 1, H signal to output terminal 74 so that signal J changes from a logical 0 to a logical 1. At time $T_2$, slave portion 63 is rendered conductive and applies the logical 1, J signal to output terminal 76 so that the signal state of the signal K changes from logical 0 to a logical 1. Consequently, slightly after time $T_2$, NOR gate 172 provides a logical 0, H signal. At time $T_3$, master portion 59 is again rendered conductive and applies the logical 0, H signal to output terminal 74 so that the J signal changes back to the logical 0 state. Moreover, the logical 1 at output terminal 76 is conducted by master portion 78 to output terminal 103 to change the L signal to a logical 1 state. At time $T_4$, slave portion 63 is rendered conductive to change the K signal to a logical 0 level and slave portion 88 is rendered conductive to change signal M to a logical 1 level. At time $T_5$ master portions 59 and 78 are rendered conductive. Consequently, master portion 78 conducts the logical 0 from output 76 of slave portion 63 to change the L signal from a logical 1 to a logical 0. Hence, in response to input clock bar cycles 204, 206 and 208, divider 170 provides, for instance, one K cycle 210. Therefore, divider 170 divides-by-three. The odd multiple divisor can be increased by adding additional "master-slave" pairs to circuit 170 between the output of NOR gate 172 and the input to master portion 59.

What has been described, therefore, are circuit configurations for odd multiple divide-by-three and divide-by-five dividers that can be expanded to provide nearly any order of odd multiple division. The dividers are suitable for manufacture by well-known CMOS processes to provide a compact, low power integrated circuit. Consequently, the described divider circuits are suitable for use in compact electronic equipment having a limited supply of power such as horological instruments and portable communication systems. One of the main advantages of the divider circuits of the invention is that they require less devices and therefore take up less chip area than some prior art configurations. Hence, yield rates for the divider circuits of the invention are correspondingly higher than for those of some prior art circuits. Furthermore, the dividers of the invention are substantially immune to spurious signals such as are caused by "switch bounce" and the dividers are easily reset to facilitate their utilization in counters.

I claim:

1. An odd-multiple divider circuit employing flip-flops and having a minimum number of circuit components each flip-flop including a master and a slave section, each master and each slave section being comprised of a first and a second Complementary-Metal-Oxide-Semiconductor-Field-Effect-Transistor (CMOSFET) transmission gate and a pair of series connected CMOSFET inverters, the first CMOSFET transmission gate of each master and slave section having an output terminal connected to the input terminal of the pair of series connected CMOSFET inverters thereof, the second CMOSFET transmission gate of each master and slave section providing a feedback path from the output terminal of the pair of series connected CMOSFET inverters to the input terminal of the pair of series connected CMOSFET inverters, the output terminal of the series connected CMOSFET inverters of each master section of each flip-flop being connected to the input terminal of the first CMOSFET transmission gate of each slave section of the flip-flop, each of the CMOSFET transmission gates of each master and slave section having control terminals adapted to receive a clock signal having a pair of periodic and complementary binary signals, the divider circuit including in combination:

a first one of the flip-flops having an input terminals and a single output terminal, said input terminal being connected to the input terminal of the first CMOSFET transmission gate of the master section of said first flip-flop, said single output terminal being connected to the output terminal of the pair of series connected CMOSFET inverters of the slave section of said first flip-flop;

a second one of the flip-flops having an input terminal and first and second output terminals, said input terminal being connected to the input of the first CMOSFET transmission gate of the master section of said second flip-flop, said input terminal also being connected to said single output terminal of said first flip-flop, said first output terminal being connected to the output terminal of the pair of series connected CMOSFET inverters of the master section of said second flip-flop, said second output terminal being connected to the output terminal of the pair of series connected CMOSFET inverters of the slave section of said second flip-flop;

the operation of said first and second flip-flops thereby being continuously dependent on each cycle of the clock signal to transfer the logic state at the input terminals thereof to the output terminals thereof regardless of the logic state at the input terminals thereof;

gate means having first, second and third input terminals and an output terminal, said first input terminal being connected to said output terminal of said first flip-flop, said second input terminal being connected to said second output terminal of said second flip-flop;

first circuit means coupling said output terminal of said gate means to said input terminal of said first flip-flop; and second circuit means coupling said first output terminal of said second flip-flop to said third input terminal of said gate means for rendering the divider circuit suitable to divide the frequency of the clock signal by an odd-multiple integer, the odd-multiple divider circuit having a minimum number of circuit components.

2. The divider circuit of claim 1 wherein said gate means is a NAND gate.

3. The divider circuit of claim 2 wherein said NAND gate includes a reset terminal; and further including third circuit means connected to said reset terminal to supply a control signal which resets the divider.

4. The divider circuit of claim 1 wherein said gate means is a NOR gate.

5. The divider circuit of claim 4 wherein said NOR gate includes a reset terminal; and further including third circuit means connected to said reset terminal to supply a control signal which resets the divider.

6. The divider circuit of claim 1 wherein said first circuit means includes a third one of the flip-flops, said flip-flop having an input terminal and a single output terminal, said input terminal being connected to the first CMOSFET transmission gate of the master section thereof, said single output terminal being connected to the output of the pair of series connected CMOSFET inverters of the slave section thereof.

7. The divider circuit of claim 6, wherein:

the first CMOSFET transmission gate of each master section and the second CMOSFET transmission gate of each slave section of said first and second flip-flops being rendered conductive at one instant of time in response to the clock signal; and the second CMOSFET transmission gate of each master section and the first CMOSFET transmission gate of each of the slave sections of said first and second flip-flops being rendered conductive at another instant of time in response to the clock signal.

8. The divider circuit of claim 6 being suitable for dividing the frequency of the clock signal by five.

9. The divider circuit of claim 1 being suitable for dividing the frequency of the clock signal by three.

* * * * *